(12) United States Patent
Malhotra et al.

(10) Patent No.: US 6,320,410 B1
(45) Date of Patent: Nov. 20, 2001

(54) HETEROGENEOUS CPLD LOGIC BLOCKS

(75) Inventors: Vinod Malhotra, Fremont;
Christopher W. Jones, Pleasanton, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/525,955

(22) Filed: Mar. 15, 2000

Related U.S. Application Data
(60) Provisional application No. 60/124,868, filed on Mar. 17, 1999.

(51) Int. Cl.[7] .................................................. G06F 7/38
(52) U.S. Cl. ................................. 326/39; 326/40; 326/38
(58) Field of Search ................................. 326/38, 39, 40, 326/41

(56) References Cited

U.S. PATENT DOCUMENTS

| | | | |
|---|---|---|---|
| 5,612,631 | * 3/1997 | Agrawal et al. | 326/39 |
| 5,757,207 | * 5/1998 | Lytle et al. | 326/39 |
| 5,848,285 | * 12/1998 | Kapusta et al. | 395/800.01 |
| 5,963,048 | * 10/1999 | Harrison et al. | 326/39 |
| 6,100,714 | * 8/2000 | Xiao et al. | 326/39 |
| 6,150,841 | * 11/2000 | Agrawal et al. | 326/41 |
| 6,198,305 | * 3/2001 | Skahill et al. | 326/41 |

OTHER PUBLICATIONS

Cyress Programmable Logic Data Book, 1997, pp. 3–34 through 3–59.

* cited by examiner

*Primary Examiner*—Michael Tokar
*Assistant Examiner*—V. Tran
(74) *Attorney, Agent, or Firm*—Christopher P. Maiorana, P.C.

(57) ABSTRACT

A programmable logic device comprising a first plurality of logic blocks each comprising a first number of I/O macrocells, a second plurality of logic blocks each comprising a second number of I/O macrocells and a configuration circuit configured to enable one or more of said first plurality of logic blocks and/or one or more of said second plurality of logic blocks.

17 Claims, 3 Drawing Sheets

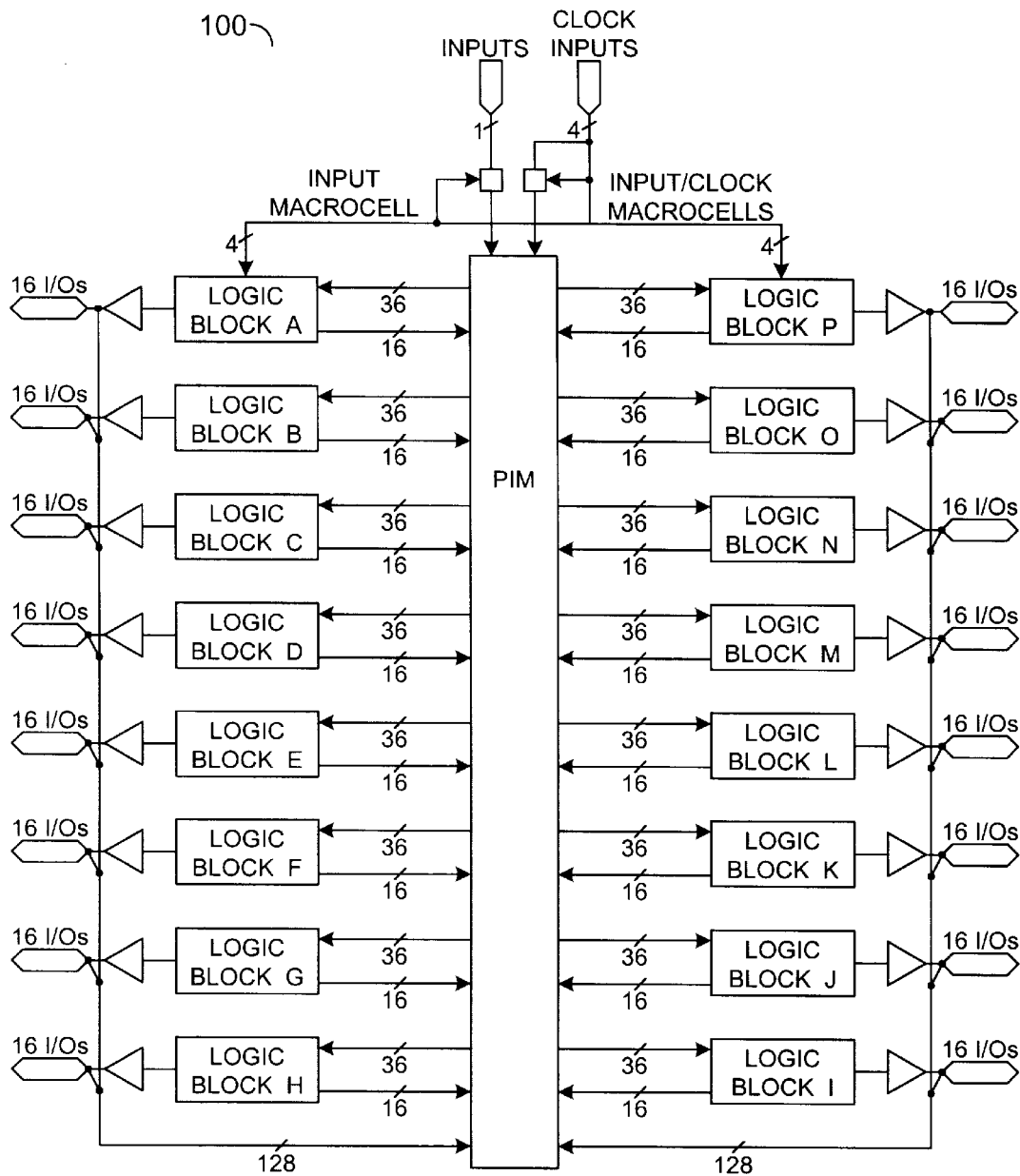
FIG. 1
(CONVENTIONAL)

HETEROGENEOUS CPLD LOGIC BLOCKS

This application claims the benefit of U.S. Provisional Application No. 60/124,868, filed Mar. 17, 1999 which is hereby incorporated by reference in its entirety.

FIELD OF THE INVENTION

The present invention relates to Complex Programmable Logic Devices (CPLDs) generally and, more particularly, to a circuit, method and architecture for optioning the density of a CPLD to provide convenient design migration.

BACKGROUND OF THE INVENTION

CPLD families may have a variety of variations such as multiple densities, multiple packages, multiple voltages and multiple speeds. Referring to FIG. 1, a CPLD having 16 logic blocks with each logic block having 16 I/Os is shown. An example of such a CPLD can be found in "Programmable Logic Data Book 1996 (and 1997)" by Cypress Semiconductor Corp., which is hereby incorporated by reference in its entirety. The following TABLE 1 illustrates some of the density and package combinations offered within a particular family:

TABLE 1

| Part | Macrocells | I/O Pins |
|---|---|---|
| 32P44 | 32 | 32 |
| 64P44 | 64 | 32 |
| 64P84 | 64 | 64 |
| 128P84 | 128 | 64 |
| 128P160 | 128 | 128 |
| 192P160 | 192 | 120 |
| 256P160 | 256 | 128 |
| 256P208 | 256 | 160 |
| 256P256 | 256 | 192 |
| 384P208 | 384 | 160 |
| 384P256 | 384 | 192 |
| 512P208 | 512 | 160 |
| 512P256 | 512 | 192 |
| 512P352 | 512 | 256 |

As shown in TABLE 1, there are several instances where two different densities are offered with the same number of I/O pins. The first example is the 32P44 and the 64P44. The 32P44 has half the macrocell density of the 64P44, while both have 32 I/O pins. Both parts are available in identical packages with identical pin definitions, thus allowing either part to be used in the same physical location in a board or system design. This characteristic of a family may enable design migration (i.e., the ability for customers to migrate a design to a different density while keeping the same footprint on their printed circuit board).

Providing design migration requires that a given density be offered with multiple I/O configurations. An example from TABLE 1 is the 256-macrocell density being offered with 128, 160, and 192 I/Os. These different I/O configurations are almost always implemented by completing one base design that can be optioned to generate the different configurations required. The optioning is usually done as a mask option, bond option, or programming option.

Additionally, the implementation may allow two different densities to be included in the same base design with optioning provided to generate the two densities. As an example, the 192-macrocell and 256-macrocell designs can be implemented as one base design with a metal mask option to differentiate the two densities. The different I/O options of the 256 macrocell part for 128, 160, and 192 I/Os can then be accomplished with bond options in the appropriate packages.

The method of optioning a base design to offer multiple device densities may not be used in all CPLD designs. Offering a device with a number of macrocells that are less than the total number of macrocells on the die is more costly in silicon. However, such an approach may reduce the overall design and production costs by reducing the overall number of parts that have to be designed and produced.

From a software perspective, it is generally advantageous to have homogeneous logic blocks of a particular density and package. Part of this homogeneity is having the same number of I/Os in each of the logic blocks. The advantage to the software comes in the partitioning portion of fitting a design, since having identical logic blocks allows like sections of a design to be known to fit into any of the available logic blocks. This advantage is sometimes taken away by the user of the CPLD as a user can choose to reserve pins for future use, thus removing the natural homogeneity included.

One conventional approach for optioning a base design to offer a smaller device density with the same number of I/Os is to completely disable some logic blocks while at the same time increasing the number of I/O macrocells in the logic blocks that remained enabled.

Such a conventional method is explained in connection with the following TABLE 2. The CPLD illustrated has 16 logic blocks with 16 macrocells in each logic block. The physical layout is organized with eight logic blocks on the left and eight on the right. TABLE 2 shows the 16 logic blocks of a particular design, with the number of I/O macrocells that are contained within each logic block.

TABLE 2

| 192 P160 | 256 P256 | 256 P208 | 256 P160 | Logic Block | Logic Block | 256 P160 | 256 P208 | 256 P256 | 192 P160 |
|---|---|---|---|---|---|---|---|---|---|
| 10 | 12 | 10 | 8 | A | P | 8 | 10 | 12 | 10 |
| 10 | 12 | 10 | 8 | B | O | 8 | 10 | 12 | 10 |
| (dis) | 12 | 10 | 8 | C | N | 8 | 10 | 12 | (dis) |
| 10 | 12 | 10 | 8 | D | M | 8 | 10 | 12 | 10 |
| 10 | 12 | 10 | 8 | E | L | 8 | 10 | 12 | 10 |
| (dis) | 12 | 10 | 8 | F | K | 8 | 10 | 12 | (dis) |
| 10 | 12 | 10 | 8 | G | J | 8 | 10 | 12 | 10 |
| 10 | 12 | 10 | 8 | H | I | 8 | 10 | 12 | 10 |

For the 256P160, which has 128 I/Os, each of the 16 logic blocks has eight I/O macrocells, thus generating the 128 total I/O macrocells. For the 256P208, which has 160 I/Os, each of the 16 logic blocks has ten I/O macrocells, thus generating the 160 total I/O macrocells. For the 256P256, which has 192 I/Os, each of the 16 logic blocks has 12 I/O macrocells, thus generating the 192 total I/O macrocells.

For the 192P160, four of the logic blocks are completely disabled (i.e., the logic blocks C, F, K, and N). The remaining 12 logic blocks are enabled each having 10 I/O macrocells, which generates 120 I/O macrocells. Comparing the 256P160 to the 192P160 shows that four logic blocks have been disabled while the number of I/O macrocells in a logic block has been increased from eight on the 256P160 to 10 on the 192P160.

The 192P160 and the 256P160 are two density and package combinations that are intended to allow design migration. As TABLE 2 shows, the 192P160 provides 120 I/Os while the 256P160 provides 128 I/Os. This allows reasonable design migration, but not the ideal solution. The problem stems from the 256P160 and 192P160 having 16 and 12 logic blocks, respectively, while each trying to provide 128 I/Os. 128 I/Os divided by 16 logic blocks is exactly 8, so the 256P160 provides 128 I/Os with homogeneous logic blocks. However, 128 I/Os divided by 12 logic blocks is not an integer, so the 192P160 can provide either 120 I/Os or 132 I/Os with homogeneous logic blocks.

Also, because of the constraints of the global signals within a logic block, like the block reset, block preset, or block product term clock, some of the 192P160 designs will not fit into the 256P160, thus not allowing design migration.

SUMMARY OF THE INVENTION

The present invention concerns a programmable logic device comprising a first plurality of logic blocks each comprising a first number of I/O macrocells, a second plurality of logic blocks each comprising a second number of I/O macrocells and a configuration circuit configured to enable one or more of said first plurality of logic blocks and/or one or more of said second plurality of logic blocks.

The objects, features and advantages of the present invention include providing a logic device that may (i) offer design migration by including the same number of I/Os in a higher density device as a lower density device, (ii) include heterogeneous logic blocks, (iii) include one set of logic blocks having zero I/O macrocells and/or (iv) include one set of logic blocks having a homogeneous non-zero number of macrocells.

BRIEF DESCRIPTION OF THE DRAWINGS

These and other objects, features and advantages of the present invention will be apparent from the following detailed description and the appended claims and drawings in which:

FIG. 1 is a diagram of a CPLD illustrating a homogeneous number of I/O macrocells;

DETAILED DESCRIPTION OF THE PREFERRED EMBODIMENTS

The present invention provides a new method of optioning a base design to offer a smaller device density with the same number of I/Os as in the higher density device. The higher density device may provide enough logic blocks that have zero I/O macrocells so that only some or all of these logic blocks are disabled for the smaller density device. The present invention may require that a device includes heterogeneous logic blocks (e.g., one set of logic blocks having zero I/O macrocells and a second set of logic blocks having a homogeneous, non-zero number of I/O macrocells).

Figure 2:
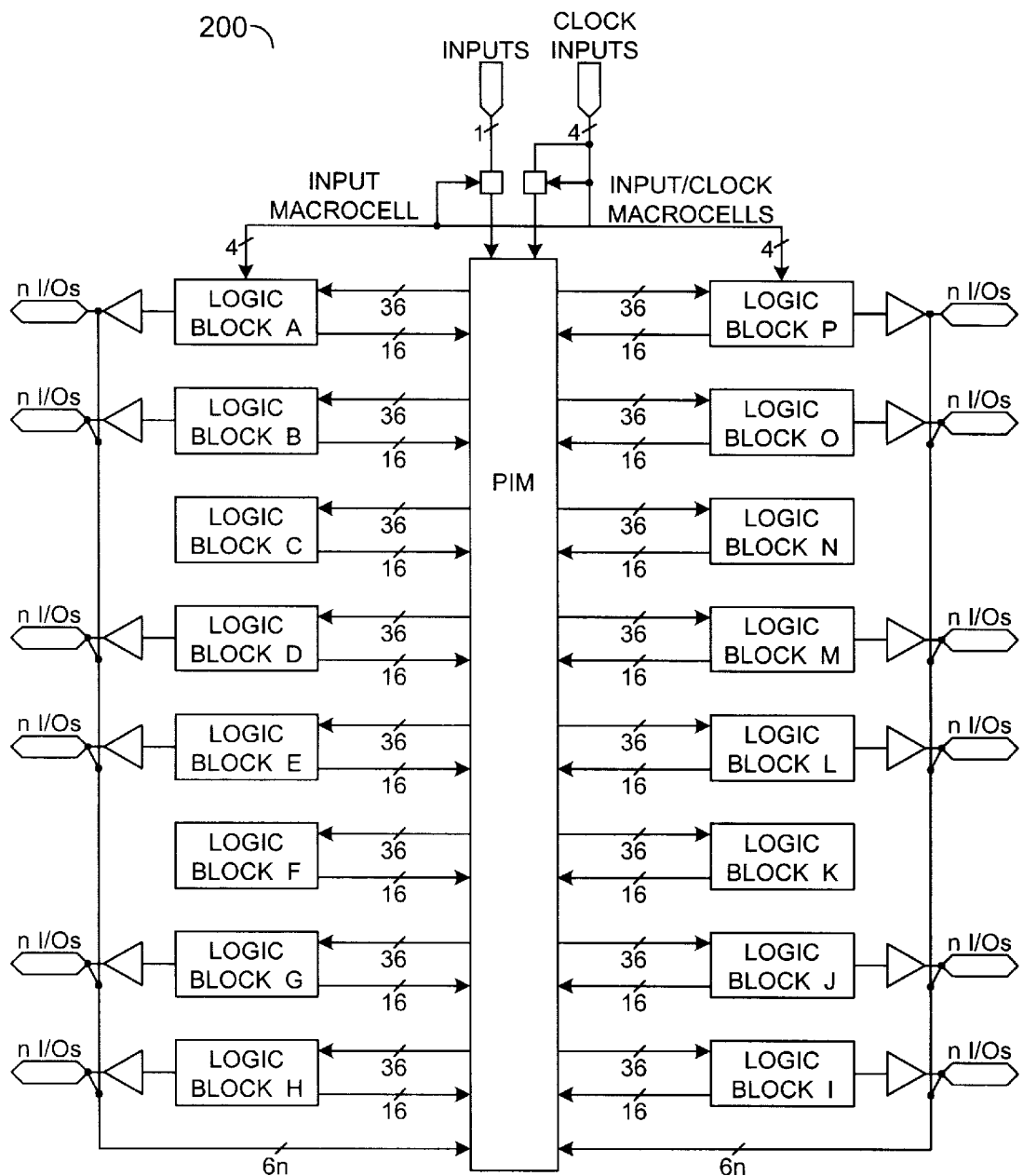
FIG. 2 is a diagram of a CPLD illustrating a heterogeneous number of I/O macrocells.

Referring to FIG. 2, a CPLD 200 is shown having 16 logic blocks (e.g., logic block A–P). However, each of the logic blocks A–P does not have an associated number of I/Os. For example, the logic block C, the logic block F, the logic block K and the logic block N are shown without any I/Os. As a result, a more convenient mapping of the logic blocks during a design migration may be accomplished. Each of the logic blocks A–P, except for logic block C, logic block F, logic block K and logic block N, have an n number of I/Os. Therefore, the particular number of I/Os per logic block may be varied accordingly to meet the design criteria of a particular implementation. Additionally, the total number of logic blocks A–P may also be varied accordingly to meet the design criteria of a particular implementation. Additionally, the particular number of logic blocks (e.g., logic block C, logic block F, logic block K and logic block N) that do not have a corresponding number of I/Os connected, may also be varied accordingly to meet the design criteria of a particular implementation.

TABLE 3 illustrates various combinations of the number of I/Os per logic block, as well as the number of logic blocks A–P and the number of logic blocks A–P without any I/Os.

Using the mapping of TABLE 3, the 192P160 and 256P160 both have 120 I/Os. This may be accomplished by introducing some of the logic blocks A–P having zero I/O macrocells (e.g., the logic blocks C, F, K and N) while still having the 16 macrocells of the logic block available within the device without direct I/O capability.

TABLE 3

| 192 P160 | 256 P256 | 256 P208 | 256 P160 | Logic Block | Logic Block | 256 P160 | 256 P208 | 256 P256 | 192 P160 |
|---|---|---|---|---|---|---|---|---|---|
| 10 | 16 | 13 | 10 | A | P | 10 | 13 | 16 | 10 |
| 10 | 16 | 13 | 10 | B | O | 10 | 13 | 16 | 10 |
| (dis) | 0 | 0 | 0 | C | N | 0 | 0 | 0 | (dis) |
| 10 | 16 | 13 | 10 | D | M | 10 | 13 | 16 | 10 |
| 10 | 16 | 13 | 10 | E | L | 10 | 13 | 16 | 10 |
| (dis) | 0 | 0 | 0 | F | K | 0 | 0 | 0 | (dis) |
| 10 | 16 | 13 | 10 | G | J | 10 | 13 | 16 | 10 |
| 10 | 16 | 13 | 10 | H | I | 10 | 13 | 16 | 10 |

For the 384P208, 384P256, 512P208, 512P256 and 512P352 devices, the I/O mapping is implemented according to the present invention as shown in the following TABLE 4:

TABLE 4

| 384 P208 | 384 P256 | 512 P208 | 512 P256 | 512 P352 | Logic Block | Logic Block | 512 P352 | 512 P256 | 512 P208 | 384 P256 | 384 P208 |
|---|---|---|---|---|---|---|---|---|---|---|---|
| 10 | 12 | 10 | 12 | 16 | AA | BP | 16 | 12 | 10 | 12 | 10 |
| 0 | 0 | 0 | 0 | 0 | AB | BO | 0 | 0 | 0 | 0 | 0 |
| 10 | 12 | 10 | 12 | 16 | AC | BN | 16 | 12 | 10 | 12 | 10 |
| (dis) | (dis) | 0 | 0 | 0 | AD | BM | 0 | 0 | 0 | (dis) | (dis) |
| 10 | 12 | 10 | 12 | 16 | AE | BL | 16 | 12 | 10 | 12 | 10 |
| (dis) | (dis) | 0 | 0 | 0 | AF | BK | 0 | 0 | 0 | (dis) | (dis) |
| 10 | 12 | 10 | 12 | 16 | AG | BJ | 16 | 12 | 10 | 12 | 10 |
| 0 | 0 | 0 | 0 | 0 | AH | BI | 0 | 0 | 0 | 0 | 0 |
| 0 | 0 | 0 | 0 | 0 | AI | BH | 0 | 0 | 0 | 0 | 0 |
| 10 | 12 | 10 | 12 | 16 | AJ | BG | 16 | 12 | 10 | 12 | 10 |
| (dis) | (dis) | 0 | 0 | 0 | AK | BF | 0 | 0 | 0 | (dis) | (dis) |
| 10 | 12 | 10 | 12 | 16 | AL | BE | 16 | 12 | 10 | 12 | 10 |
| (dis) | (dis) | 0 | 0 | 0 | AM | BD | 0 | 0 | 0 | (dis) | (dis) |
| 10 | 12 | 10 | 12 | 16 | AN | BC | 16 | 12 | 10 | 12 | 10 |

TABLE 4-continued

| 384 P208 | 384 P256 | 512 P208 | 512 P256 | 512 P352 | Logic Block | Logic Block | 512 P352 | 512 P256 | 512 P208 | 384 P256 | 384 P208 |
|---|---|---|---|---|---|---|---|---|---|---|---|
| 0 | 0 | 0 | 0 | 0 | AO | BB | 0 | 0 | 0 | 0 | 0 |
| 10 | 12 | 10 | 12 | 16 | AP | BA | 16 | 12 | 10 | 12 | 10 |

The 384P208 has 160 I/Os total that may be derived from 10 I/Os in each of 16 logic blocks, with eight logic blocks having no I/O pins and eight logic blocks being disabled so that only 384 total macrocells are enabled. The 512P208 also has 160 I/Os total that may be derived from 10 I/Os in each of 16 logic blocks having no I/O pins. Likewise, the 384P256 and 512P256 both have 192 I/Os, with the 384P256 having eight logic blocks disabled. The 512P352, which has 256 total I/Os, is also shown in TABLE 4.

The present invention may provide design migration from a smaller density to a larger density that is guaranteed. The present invention may be easier to execute the logic design, physical design and associated verification of the density options. The sort, class, characterization, and reliability programs may be easier to generate and verify. The bonding diagrams are the same for different densities in the same package. A single probe card can be used for sorting two different densities.

Figure 3:
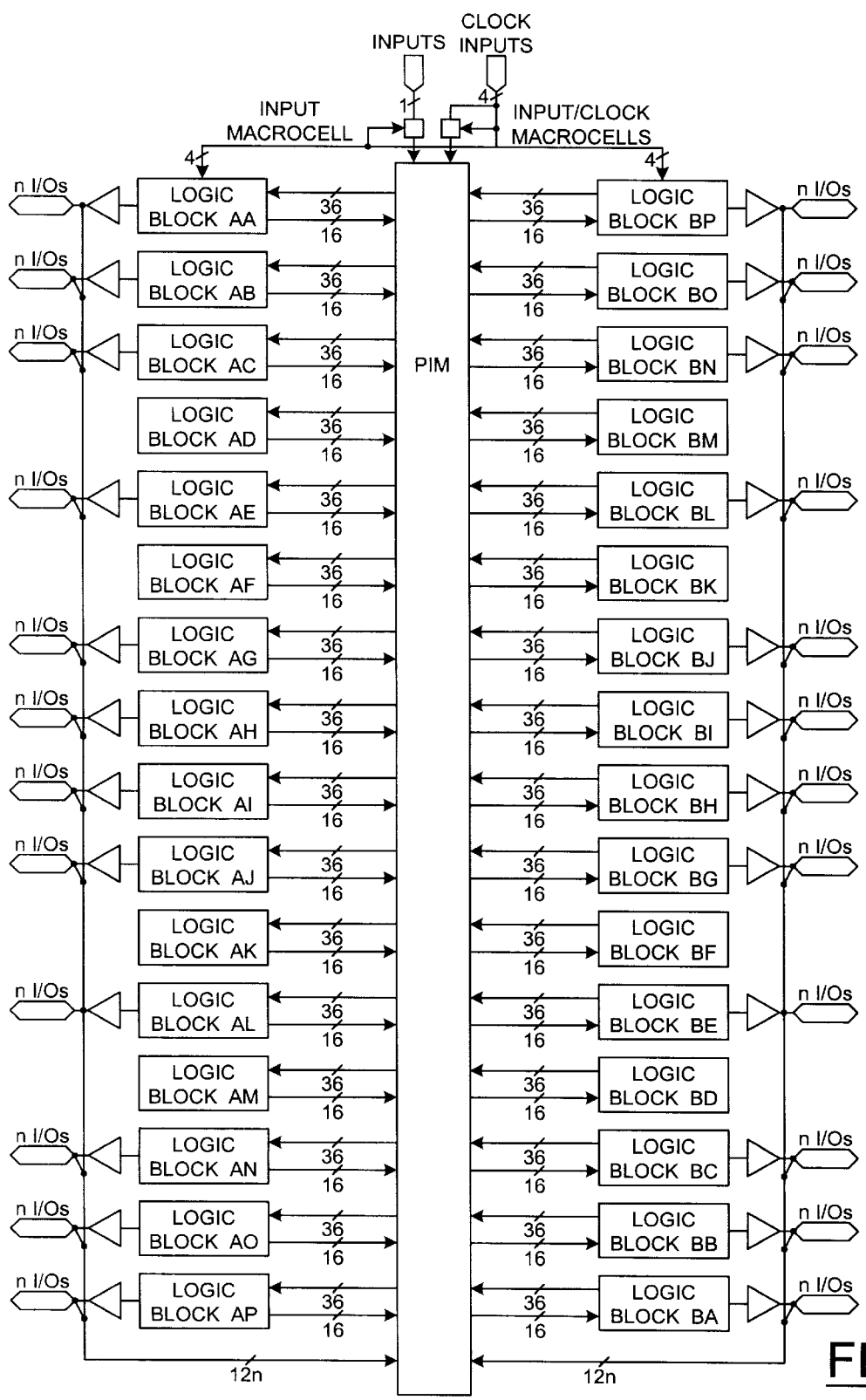
FIG. 3 illustrates an alternate embodiment of the present invention.

Referring to FIG. 3, an alternate method of the present invention is shown. The alternate method may allow a device and package combination that is not intended to provide design migration to be compatible with another device and package to provide (i) logic blocks with a non-zero number of I/O macrocells and (ii) package combinations from the same base design have zero I/O macrocells in those same physical logic blocks.

The embodiment in FIG. 3 may allow a CPLD to be implemented differently to optimize aspects of the design or software development other than I/O flexibility. Examples of such I/O mapping according to this alternate embodiment of the present invention may be shown in the following TABLE 5:

TABLE 5

| 384 P208 | 384 P256 | 512 P208 | 512 P256 | 512 P352 | Logic Block | Logic Block | 512 P352 | 512 P256 | 512 P208 | 384 P256 | 384 P208 |
|---|---|---|---|---|---|---|---|---|---|---|---|
| 10 | 12 | 10 | 12 | 12 | AA | BP | 12 | 12 | 10 | 12 | 10 |
| 0 | 0 | 0 | 0 | 12 | AB | BO | 12 | 0 | 0 | 0 | 0 |
| 10 | 12 | 10 | 12 | 12 | AC | BN | 12 | 12 | 10 | 12 | 10 |
| (dis) | (dis) | 0 | 0 | 0 | AD | BM | 0 | 0 | 0 | (dis) | (dis) |
| 10 | 12 | 10 | 12 | 12 | AE | BL | 12 | 12 | 10 | 12 | 10 |
| (dis) | (dis) | 0 | 0 | 0 | AF | BK | 0 | 0 | 0 | (dis) | (dis) |
| 10 | 12 | 10 | 12 | 12 | AG | BJ | 12 | 12 | 10 | 12 | 10 |
| 0 | 0 | 0 | 0 | 0 | AH | BI | 0 | 0 | 0 | 0 | 0 |
| 0 | 0 | 0 | 0 | 0 | AI | BH | 12 | 0 | 0 | 0 | 0 |
| 10 | 12 | 10 | 12 | 12 | AJ | BG | 12 | 12 | 10 | 12 | 10 |
| (dis) | (dis) | 0 | 0 | 0 | AK | BF | 0 | 0 | 0 | (dis) | (dis) |
| 10 | 12 | 10 | 12 | 12 | AL | BE | 12 | 12 | 10 | 12 | 10 |
| (dis) | (dis) | 0 | 0 | 0 | AM | BD | 0 | 0 | 0 | (dis) | (dis) |
| 10 | 12 | 10 | 12 | 12 | AN | BC | 12 | 12 | 10 | 12 | 10 |
| 0 | 0 | 0 | 0 | 12 | AO | BB | 12 | 0 | 0 | 0 | 0 |
| 10 | 12 | 10 | 12 | 12 | AP | BA | 12 | 12 | 10 | 12 | 10 |

Comparing TABLE 5 to the similar device and package in TABLE 4, TABLE 5 has 22 logic blocks with 12 I/O macrocells while TABLE 4 has 16 logic blocks with 16 I/O macrocells. The differences are mainly with logic blocks AB, AI, AO, BB, BH, and BO, as these logic blocks have 12 I/Os in TABLE 5 instead of zero in Table 4. The other difference is that the logic blocks for the 512P352 in TABLE 5 with I/Os have 12 I/Os instead of the 16 I/Os in TABLE 4. The implementation in TABLE 5 spreads the I/Os more broadly among the logic blocks, thus providing more product terms, more reset and preset conditions, and more output enable conditions for the I/Os available. The total number of I/Os is different in the two cases, as TABLE 5 has 264 I/Os versus TABLE 4 with 256 I/Os, but this is unimportant for design migration purposes.

The present invention may provide a CPLD that may have (i) a number of heterogeneous logic blocks and (ii) a number of completely buried logic blocks. For example, no I/O macrocells may be present in a particular logic block and no programmable routing may be present between the macrocells and the I/O pins.

The present invention may make logic design, physical design and associated verification of the density options easier, which may save engineering time. Making the sort, class, characterization, and reliability programs easier to generate and verify may also save engineering time. Making the bonding diagrams the same for different densities in the same package may save assembly engineering time and may help to avoid errors. The present invention may facilitate using a single probe card for sorting a wide variety of CPLDs.

While the invention has been particularly shown and described with reference to the preferred embodiments thereof, it will be understood by those skilled in the art that various changes in form and details may be made without departing from the spirit and scope of the invention.

What is claimed is:

1. A programmable logic device comprising:

a first plurality of logic blocks each comprising a first number of I/O macrocells;

a second plurality of logic blocks each comprising a second number of I/O macrocells; and a configuration circuit configured to enable one or more of said first plurality of logic blocks and/or one or more of said second plurality of logic blocks, wherein said first number is equal to a positive integer and said second number is zero.

2. The programmable logic device according to claim 1, wherein one or more of said logic blocks are heterogeneous.

3. The programmable logic device according to claim 1, wherein said one or more of logic blocks have no I/O macrocells.

4. The programmable logic device according to claim 3, wherein said device has no programmable routing between said macrocells and one or more of said I/O pins.

5. The programmable logic device according to claim 4, wherein one or more of said logic blocks have zero I/O macrocells, wherein said logic blocks with zero I/O macrocells allow production of a lower density device by disabling some or all of the logic blocks.

6. The programmable logic device according to claim 5, wherein said device is configured to allow migration of a design to a different density while keeping the same footprint.

7. The programmable logic device according to claim 6, wherein one or more groups of said devices have a different number densities, wherein each group is sorted with a single probe card.

8. The programmable logic device according to claim 1, wherein a first set of one or more of said logic blocks have a positive number of I/O macrocells and a second set of one or more of said logic blocks have zero I/O macrocells, wherein said first and second sets of logic blocks are in the same physical logic blocks.

9. A method for configuring a programmable logic device having a first plurality of logic blocks comprising a first number of I/O macrocells and a second plurality of logic blocks comprising a second number of I/O macrocells, comprising the steps of:

(A) enabling one or more of said first plurality of logic blocks; and (B) enabling one or more of said second plurality of logic blocks, wherein said first number is equal to a positive integer and said second number is zero.

10. The method according to claim 9, wherein one or more of said logic blocks are heterogeneous.

11. The method according to claim 9, wherein one or more of said logic blocks have zero I/O macrocells, wherein said logic blocks with zero I/O macrocells allow production of a lower density device by disabling some or all of the logic blocks.

12. The method according to claim 11, wherein said method allows one or more different densities of logic devices to be included in a single base design.

13. The method according to claim 12, wherein said one or more different densities have a similar bonding diagram.

14. The method according to claim 13 further comprising the step of:

sorting said different densities using a single probe card.

15. The method according to claim 9, wherein a first set of one or more of said logic blocks have a positive number of I/O macrocells and a second set of one or more of said logic blocks have zero I/O macrocells, wherein said first and second sets of logic blocks are in the same physical logic blocks.

16. A method of defining two densities of programmable logic devices that have the same total number of I/O macrocells comprising the following steps:

(A) assigning a number N1 to be the number of macrocells in the larger density device;

(B) assigning a number M1 to be the number of macrocells in the smaller density device;

(C) declaring a number J to be the number of macrocells in a logic block;

(D) declaring a number K to be the total number of I/O macrocells in each device;

(E) declaring a number N2 to be the quotient of the number N1 divided by the number J;

(F) declaring a number M2 to be the quotient of the number M1 divided by the number J;

(G) declaring a number M3 to be the quotient of the number K divided by the number M2;

(H) declaring a number M4 to be the difference between the number J and the number M3;

(I) declaring a number N5 to be the difference between the number N2 and the number M2;

(J) assigning a first density device to have a number of logic blocks equal to M2, each with a number of I/O macrocells equal to M3 and a number of buried macrocells equal to M4; and (K) assigning a second density device to have a number of logic blocks equal to N5, each with a number of buried macrocells equal to J, and a number of logic blocks equal to M2, each with a number of I/O macrocells equal to M3 and a number of buried macrocells equal to M4.

17. A programmable logic device comprising a plurality of logic blocks having the same number of macrocells, wherein at least two of said plurality of logic blocks have a different number of I/O macrocells, at least one of said plurality of logic blocks has an I/O macrocell and at least one of said plurality of logic blocks does not have an I/O macrocell.

* * * * *